United States Patent [19]

Nishizawa et al.

[11] Patent Number: 4,700,213
[45] Date of Patent: * Oct. 13, 1987

[54] MULTI-DRAIN ENHANCEMENT JFET LOGIC (SITL) WITH COMPLEMENTARY MOSFET LOAD

[75] Inventors: Jun-ichi Nishizawa, Sendai; Yasunori Mochida, Hamamatsu; Terumoto Nonaka, Hamamatsu; Takashi Yoshida, Hamamatsu, all of Japan

[73] Assignee: Nippon Gakki Seizo Kabushiki Kaisha, Hamamatsu, Japan

[ * ] Notice: The portion of the term of this patent subsequent to Mar. 10, 1998 has been disclaimed.

[21] Appl. No.: 397,863

[22] Filed: Jul. 13, 1982

Related U.S. Application Data

[63] Continuation of Ser. No. 63,575, Aug. 3, 1979, which is a continuation of Ser. No. 812,738, Jul. 5, 1977, abandoned.

[30] Foreign Application Priority Data

Jul. 5, 1976 [JP] Japan .................. 51-79578

[51] Int. Cl.⁴ ............... H01L 27/04; H03K 19/091
[52] U.S. Cl. ........................... 357/42; 357/22; 357/43; 357/92
[58] Field of Search ............... 357/22, 23.1, 43, 44, 357/46, 92, 41, 42, 22 C, 22 D, 22 E

[56] References Cited

U.S. PATENT DOCUMENTS

| | | | |
|---|---|---|---|
| 3,828,230 | 8/1974 | Nishizawa | 357/22 |
| 3,924,265 | 12/1975 | Rodgers | 357/41 |
| 3,969,632 | 7/1976 | Bobenrieth | 357/22 |
| 4,255,671 | 3/1981 | Nonaka et al. | 357/92 |
| 4,259,681 | 3/1981 | Nishizawa | 357/92 |

FOREIGN PATENT DOCUMENTS

| | | | |
|---|---|---|---|
| 2655917 | 6/1977 | Fed. Rep. of Germany | 357/92 |
| 1398862 | 6/1975 | United Kingdom | 357/92 |
| 47903 | 3/1979 | U.S.S.R. | 357/92 |

*Primary Examiner*—William D. Larkins
*Attorney, Agent, or Firm*—Cushman, Darby & Cushman

[57] ABSTRACT

A semiconductor integrated logic circuit comprises a load transistor having a carrier injecting region and a carrier extracting region and an inverter transistor having a source region, drain regions, channel regions each connected between the source region and each of the drain regions, and gate regions defining the respective channel regions therebetween. The extracting region is merged into the gate regions. The channel regions have such dimensions and an impurity concentration that the channels are closed with depletion layers extending from the gate regions at zero gate voltage. The gate regions constitute a logic input and the drains constitute logic outputs. The zero gate voltage renders the channels non-conductive and the raised voltage renders the channels conductive, thus realizing an inverter circuit useful for wired logics.

1 Claim, 12 Drawing Figures

MULTI-DRAIN ENHANCEMENT JFET LOGIC (SITL) WITH COMPLEMENTARY MOSFET LOAD

This is a continuation of application Ser. No. 063,575 filed Aug. 3, 1979, which is a continuation of application Ser. No. 812,738 filed on July 5, 1977, both now abandoned.

CROSS REFERENCE TO RELATED APPLICATIONS

Of interest are the following copending applications. Ser. No. 748,292 and Ser. No. 817,053 filed respectively on Dec. 7, 1976 and July 19, 1977 by Jun-Ichi Nishizawa, one of the present inventors.

BACKGROUND OF THE INVENTION (a) Field of the Invention

The present invention relates to a semiconductor integrated logic circuit, and more particularly it pertains to a monolithic semiconductor integrated circuit of the merged transistor logic (MTL) type.

(b) Description of the Prior Art

A merged transistor logic circuit (MTL), conventionally known, is a monolithic semiconductor circuit comprising: inverter transistors having their input terminals and output terminals connected in logic fashion respectively so as to perform the required logic operations; and a plurality of injector transistors for injecting charge carriers into the inverter transistors (c.f. U.S. Pat. No. 3,736,477 granted to Berger et al). Such an MTL circuit attains a remarkable success in realizing a high density packaging and a low power consumption. However, since both the inverter and the injector transistors of known MTL circuits are formed with bipolar transistors, there remains many problems to be solved with respect to the switching speed, power loss, clocking, and so forth in the conventional MTL circuits.

More detailed description of the conventional MTL circuit will be described hereinbelow by referring to FIGS. 1 and 2.

Figure 1:
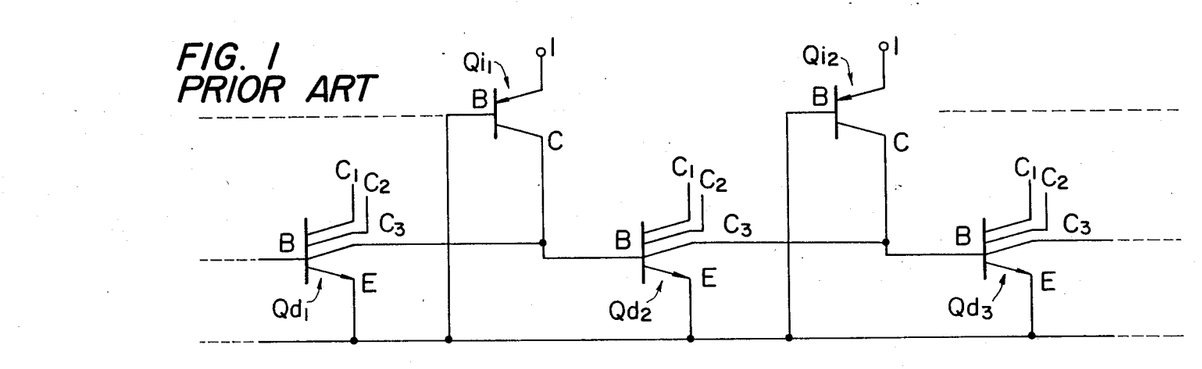
FIG. 1 is a partial electric connection diagram of a conventional integrated injection logic (IIL) circuit.

FIG. 1 shows an example of the conventional MTL circuit which is often called an IIL circuit. Inverter transistors (sometimes called driver transistors) $Q_{d1}$, $Q_{d2}$ and $Q_{d3}$ are formed with npn-type bipolar transistors, each having three collectors (as logic outputs) and a base (as a logic input) respectively connected to predetermined succeeding stages and a preceding stage. Actually, a wired AND logic of collectors respectively of the plurality of inverter transistors in the preceding stages is taken and supplied to the base of the inverter transistor of the following stage. Injector transistors $Q_{i1}$, $Q_{i2}$, ... are formed with pnp-type bipolar transistors having collectors C connected to the corresponding bases B of the inverter transistors $Q_{d2}$, $Q_{d3}$, ... The injector transistors $Q_{i1}$, $Q_{i2}$, ... are pnp-type while the inverter transistors $Q_{d1}$, $Q_{d2}$, ... are npn-type as described above. Here, the collector regions of the injector transistors $Q_{i1}$, $Q_{i2}$, ... also constitute or are merged to the base regions of the inverter transistors $Q_{d2}$, $Q_{d3}$, ..., respectively, and the base regions of the injector transistors $Q_{i1}$, $Q_{i2}$, ... also constitute or are merged to the emitter regions of the inverter transistors $Q_{d2}$, $Q_{d3}$, ..., respectively. Therefore, the base-collector junction of an injector transistor also serves as the emitter-base junction of an inverter transistor. The injector transistors $Q_{i1}$, $Q_{i2}$, ... are connected in the common-base (base-grounded) configuration, so that they work as the constant current sources, or more particularly, as the charge carrier supplies.

For example, when a positive voltage is applied to the injection electrode (emitter electrode) I of the pnp-type injector transistor $Q_{i1}$ while the npn-type inverter transistor $Q_{d1}$ (of the preceding stage) is turned off, charge carriers (positive holes) are injected from the emitter I to the base B and extracted to the collector C of the pnp-type injector transistor $Q_{i1}$ and then poured into the base B of the npn-type inverter transistor $Q_{d2}$, thereby to let the base current flow and to turn the inverter transistor $Q_{d2}$ on. When the driver transistor $Q_{d1}$ is turned on thereafter, the charge carriers injected from the injector transistor $Q_{i1}$ are absorbed in the turned-on inverter transistor $Q_{d1}$ of the preceding stage and the inverter transistor $Q_{d2}$ is now rendered off. Similar operations are accomplished in the successive stages. Clocking of the IIL circuit is performed generally by the application of clock pulses to the injection electrodes I of the injector transistors $Q_{i1}$, $Q_{i2}$, ....

Figure 9:
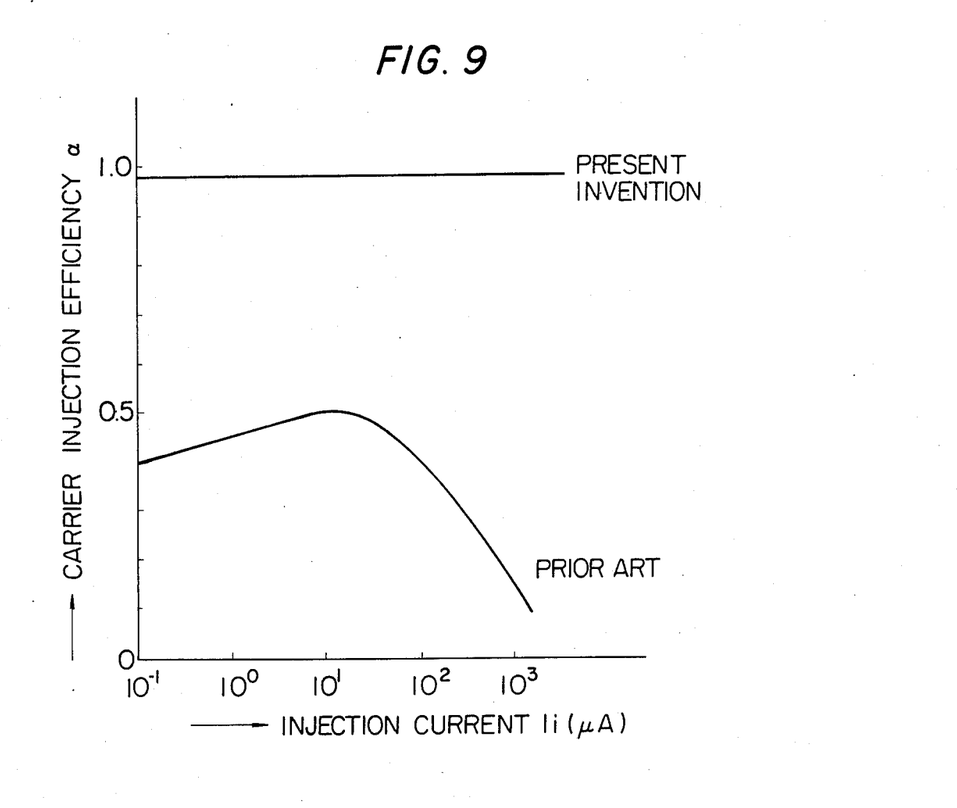
FIG. 9 is a graphic chart showing the injection current vs. carrier injection efficiency $\alpha$ characteristic of the injector transistor of the conventional IIL semiconductor device and the semiconductor integrated logic circuit of the embodiment shown in FIG. 8.

In such conventional IIL circuit, the total switching speed of the circuit depends on the switching speed of the respective inverter transistors $Q_{d1}$, $Q_{d2}$, ... and injector transistors $Q_{i1}$, $Q_{i2}$, ... and also depends on the carrier injection efficiency of the injector transistors $Q_{i1}$, $Q_{i2}$, ... (which is equal to the current amplification factor $\alpha$ in the base-grounded connection). Namely, the turn-off speed of the inverter transistors $Q_{d1}$, $Q_{d2}$, ... is limited by the carrier storage effect thereof, since they are bipolar transistors, while the turn-on speed of the inverter transistors $Q_{d1}$, $Q_{d2}$, ... is subjected to the influence of the carrier injection efficiency of the injector transistors $Q_{i1}$, $Q_{i2}$, .... In other words, for improving the turn-on speed of the inverter transistors $Q_{d1}$, $Q_{d2}$, ..., the injector transistors should inject (pour) sufficiently many carriers into the base region of the inverter transistors $Q_{d1}$, $Q_{d2}$, ... so as to raise the base potential rapidly. The carrier injection efficiency $\alpha$ of the injector transistor of the conventional IIL circuit is low and it further rapidly decreases when the injection current (the emitter current of the injector transistor) $I_i$ exceeds the value of about 100 $\mu$A, as is shown in FIG. 9. Therefore, the power loss increases for injecting sufficiently many charge carriers into the inverter transistor. Furthermore, even if sufficient charge carriers can be injected, the resultant charge storing effect in the inverter transistor further decreases the turn-off speed. Yet further, since clocking is achieved by applying clock pulses to the injection electrode I of a low input impedance, a considerably large power is required for clocking.

Figure 2:
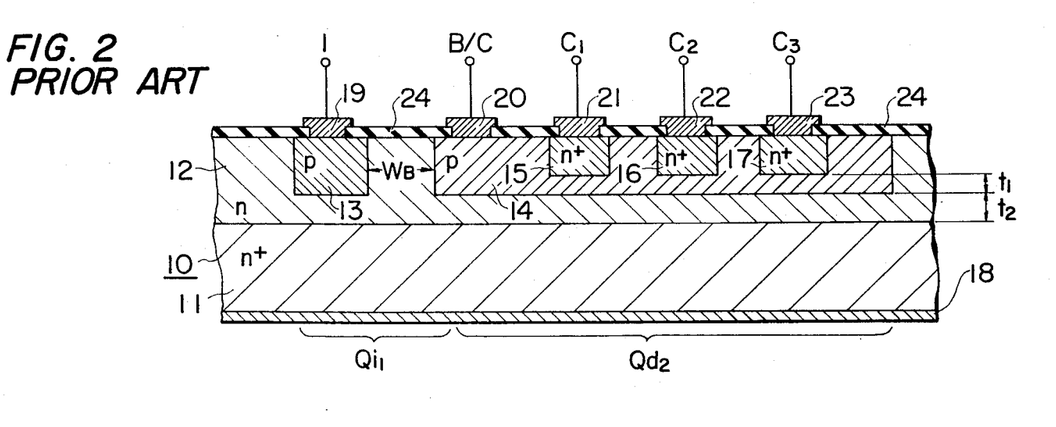
FIG. 2 is a partial cross-section of an example structure of the conventional IIL circuit shown in FIG. 1.

FIG. 2 shows a partial cross-sectional structure of the conventional IIL having a circuit connection as shown in FIG. 1. In FIG. 2, a semiconductor wafer 10 is formed by growing an n-type semiconductor layer 12 of a relatively high resistivity on an n-type (n+-type) semiconductor substrate 11 of a low resistivity. In the n-type semiconductor layer 12, p-type semiconductor regions 13 and 14 of a relatively low resistivity are formed by relying on, for example, the selective diffusion technique. In the p-type semiconductor region 14, n-type (n+- type) semiconductor regions 15, 16 and 17 of a further low resistivity are formed by, for example, the selective diffusion technique. Respective electrodes 18, 19, 20, 21, 22 and 23 are formed on the exposed surface of the substrate 11 and the semiconductor regions 13, 14, 15, 16 and 17. An oxide layer 24 passivates the surface of the wafer 10 except for the electrode portions.

The semiconductor regions 12, 13 and 14 constitute the base, emitter and collector, respectively, of the pnp-type injector transistor $Q_{i1}$, while the semiconductor regions 12, 14 and 15 - 16 - 17 constitute the emitter, base and collectors, respectively, of the npn-type multi-collector inverter transistor $Q_{d2}$. Namely, the base region 12 of the injector transistor $Q_{i1}$ serves also as the emitter of the inverter transistor $Q_{d2}$ and the collector region 14 of the pnp-type injection transistor serves also as the base of the npn-type inverter transistor $Q_{d2}$.

As can be easily understood from the above-stated structure, in order to decrease the carrier storage effect of the inverter transistor $Q_{d2}$, the thicknesses $t_1$ and $t_2$ of the portions of the semiconductor regions 12 and 14 indicated in the figure should be reduced sufficiently. From a practical viewpoint, it is very difficult to satisfy such conditions from the viewpoint of manufacture and will cause relatively large variance in the products. Furthermore, there are also limitations from the aspects of other electric characteristics.

Part of the carriers injected from the emitter 13 of the injector transistor $Q_{i1}$ is collected (extracted) by the collector and injected again (or double injected) into the emitter. To increase the ratio of charge carriers collected by the collector 14 to the total of the injected (emitted) carriers, the base width which is indicated by WB in the figure should be decreased to as narrow a width as possible. However, there is a limit, from the viewpoint of manufacture, in decreasing this width of the base WB in the lateral bipolar transistor. This constitutes the main reason for the low carrier injection efficiency $\alpha$. Furthermore, as the number of charge carriers collected to the collector 14 will increase while the preceding stage inverter transistor is rendered off, the potential at the collector 14 will increase to cause a reverse or backward injection to develop from the collector to the base. Furthermore, the emitter-base PN junction is forwardly and deeply biased, and hence the effect of the base resistance will become to play a larger role to raise the ratio of carriers travelling to the semiconductur substrate. This is the cause for the above-mentioned phenomenon that the carrier injection efficiency $\alpha$ decreases as the injection current $I_i$ increases beyond a certain value.

SUMMARY OF THE INVENTION

Therefore, an object of the present invention is to provide a semiconductor integrated logic circuit which has a novel structure and which eliminates the drawbacks of the prior art.

Another object of the present invention is to provide a semiconductor integrated logic circuit of the type described above, which improves the switching speed of the inverter transistor with very little power dissipation.

Still another object of the present invention is to provide a semiconductor integrated logic circuit of the type described above, which has a low power loss ability and has load transistor, the carrier injection efficiency $\alpha$ of which keeps a high value even at sufficiently large currents.

Yet, another object of the present invention is to provide a semiconductor integrated logic circuit of the type decribed above, which reduces the power required for clocking.

A further object of the present invention is to provide a semiconductor integrated logic circuit of the type described above, which has load transistor capable of allowing a large current to flow at a low voltage.

According to an aspect of the present invention, a semiconductor integrated logic circuit comprises: at least one inverter transistor formed with a junction field effect transistor having a channel closed with depletion layers extending from gate regions at zero gate voltage, and at least one load transistor capable of injecting carriers into the gate of the inverter junction field effect transistor and controlling the potential of the gate in accordance with the input logic voltage to the gate, thereby affecting the depletion layers.

According to another aspect of the present invention, load transistor is formed with an insulated gate type field effect transistor, and an inverter transistor is formed with a junction field effect transistor, the drain of the insulated gate type load field effect transistor being continuous or merged to the gate of the inverter junction field effect transistor.

According to still another aspect of the present invention, a load transistor is formed with an insulated gate type field effect transistor, and an inverter transistor is formed with a junction field effect transistor, the channel of the insulated gate type load field effect transistor being formed within the gate of the inverter junction field effect transistor.

These and other objects, as well as the features and the advantages of the present invention will become apparent from the following detailed description of the preferred embodiments when taken in conjunction with the accompanying drawings.

DETAILED DESCRIPTION OF THE PREFERRED EMBODIMENTS

Figure 3:
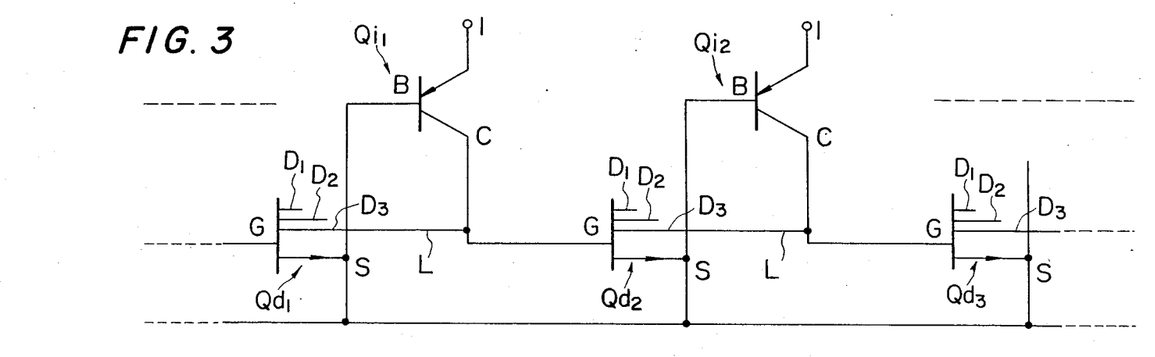
FIG. 3 is a partial electric connection diagram of a semiconductor integrated logic circuit according to an embodiment of the present invention.

FIG. 3 is a semiconductor integrated logic circuit according to an embodiment of the present invention, in which similar symbols are used to indicate circuit components having similar functions. Namely, according to the present embodiment, each of inverter transistors $Q_{d1}$, $Q_{d2}$, ... is formed with an N channel junction field effect transistor having three drains, while each load transistor is comprised of a bipolar transistor. The mutual connection among the inverter transistors $Q_{d1}$, $Q_{d2}$, ... and the load transistors $Q_{i1}$, $Q_{i2}$, ... may be similar to the conventional IIL semiconductor device.

Figure 4:
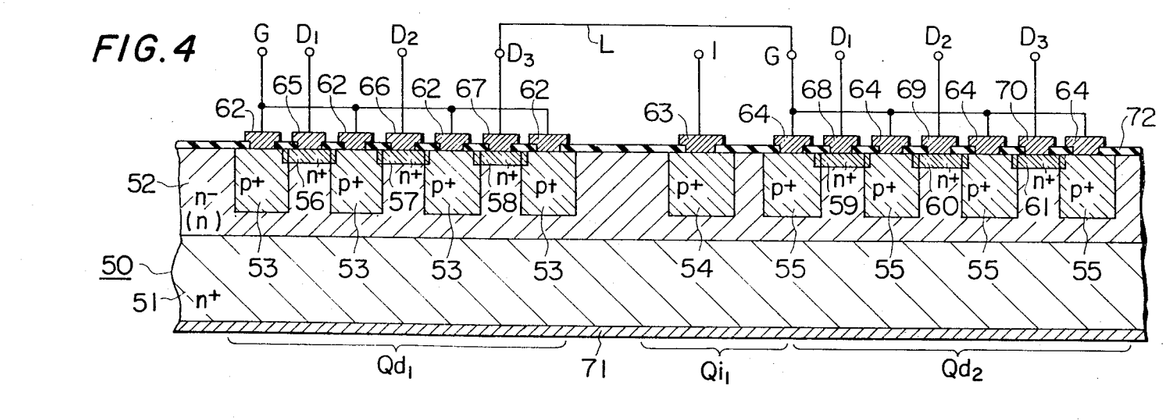
FIG. 4 is a partial cross-section of an example structure of the semiconductor integrated logic circuit shown in FIG. 3.
Figure 5:
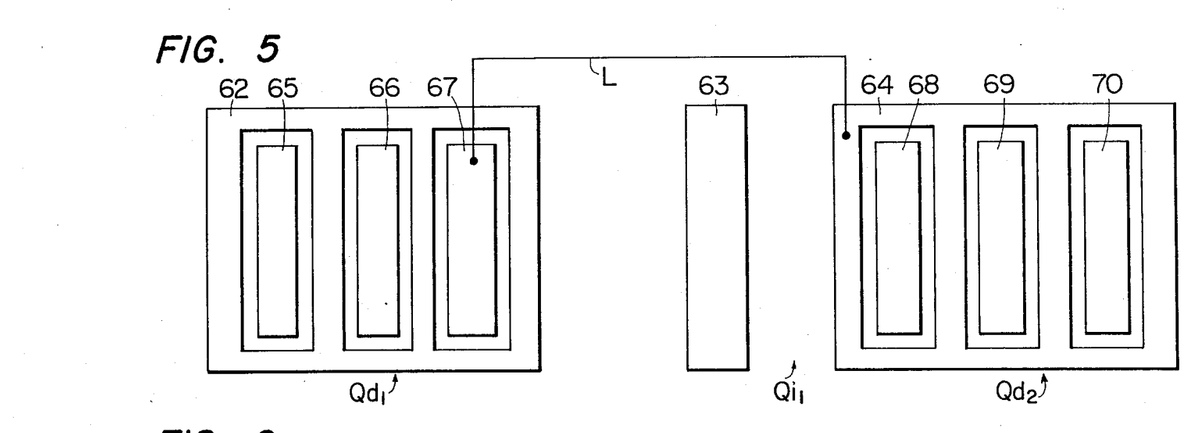
FIG. 5 is a schematic diagram showing a plan view of an example of the electrode configuration of the IIL semiconductor integrated logic circuit shown in FIGS. 3 and 4.

FIGS. 4 and 5 show examples of a partial cross-sectional structure and an electrode configuration of the semiconductor circuit having the circuit connection of FIG. 3.

In FIG. 4, a semiconductor wafer 50 is formed by epitaxially growing an n-type semiconductor layer 52 of a relatively high resistivity on an n-type semiconductor substrate 51 of a low resistivity. The semiconductor layer 52 may also be formed by relying on the usual diffusion technique. In the n-type semiconductor layer 52, p-type semiconductor regions 53, 54 and 55 are formed by relying on the selective diffusion technique, and like techniques. In those surface portions of the n-type semiconductor layer 52 which are located between the adjacent p-type semiconductor regions 53, n-type (n+- type) semiconductor regions 56, 57 and 58 of a low resistivity are formed by relying on the selective diffusion technique, and like techniques. Similarly, in those surface portions of the n-type semiconductor layer 52 which are located between the adjacent p-type semiconductor regions 55, n-type (n+-type) semiconductor regions 59, 60 and 61 of a low resistivity are formed by relying on the selective diffusion technique, and like techniques. Electrodes 62, 63, 64, 65, 66, 67, 68, 69 and 70 are formed on the p-type semiconductor regions 53, 54 and 55 and the n-type semiconductor regions 56, 57, 58, 59, 60 and 61, respectively, by relying on the evaporation technique, or like techniques. Also, an electrode 71 is formed on the lower surface of the n-type semiconductor substrate 51. The remaining surfaces of the semiconductor wafer 50 are passivated by an oxide film 72. In practice, this oxide film 72 may be formed first, and then the portions of the oxide film corresponding to the electrodes may be removed, and the electrodes may be formed on the resulting surface portions.

The n-type semiconductor substrate 51 and the semiconductor regions 52, 53, 56, 57 and 58 constitute in combination a multi-drain, vertical, n-channel, junction field effect transistor serving as an inverter transistor $Q_{d1}$. Namely, the p-type semiconductor regions 53 serve as a gate, the n-type semiconductor substrate 51 and a part of the n-type semiconductor layer 52 adjacent to the n-type semiconductor substrate 51 serve as a source, portions of the n-type semiconductor layer 52 sandwiched by the p-type semiconductor regions 53 serve as the channels and the n-type semiconductors 56, 57 and 58 and portions of the n-type semiconductor layer 52 adjacent to the n-type semiconductor regions 56, 57 and 58 serve as the drains.

The n-type semiconductor substrate 51 and the semiconductor regions 52, 54 and 55 constitute, in combination, a PNP bipolar transistor which serves as the load transistor $Q_{i1}$. Namely, the p-type semiconductor region 54 forms an emitter (injecting region), the p-type semiconductor region 55 near the p-type region 54 serves as a collector (extracting region) and the n-type semiconductor substrate 51 and a part of the n-type semiconductor region 52 located between the p-type semiconductor regions 54 and 55 serves as a base.

The n-type semiconductor substrate 51 and the semiconductor regions 52, 55, 59, 60 and 61 constitute, in combination, an n-channel, vertical, junction field effect transistor serving as the inverter transistor $Q_{d2}$. Namely, the p-type semiconductor regions 55 serve as a gate, the n-type semiconductor substrate 51 and part of the n-type semiconductor layer 52 adjacent to the n-type substrate serve as the source, and portions of the n-type semiconductor layer 52 sandwiched by the p-type semiconductor regions 55 serve as the channels, and the n-type semiconductor regions 59, 60 and 61 and portions of the n-type semiconductor layer adjacent thereto serve as the drains.

The metal electrodes 62, 63, 64, 65, 66 and 67 may have a configuration as shown in FIG. 5. Therefore, the semiconductor regions 53, 54, 55, 56, 57 and 58 to which the electrodes 62, 63, 64, 65, 66 and 67 are ohmicly contacted may have shapes and mutual configurations responding to the corresponding electrodes.

According to the present invention, the dimensions and the carrier concentrations are selected to be within particular value ranges to ensure the intended operation. In the embodiment of FIG. 4, the substrate region has an impurity concentration of $10^{24}$–$10^{27}$ atoms/m$^3$. The n$^-$ region 52 has a thickness of 2–10 $\mu$m and an impurity concentration of $10^{18}$–$10^{21}$ atoms/m$^3$. The injection region 54 and the extracting region/gate region 55 have a depth of 1–3 $\mu$m and an impurity concentration of $10^{24}$–$10^{26}$ atoms/m$^3$. The drain take-out regions 59, 60 and 61 have a depth of 1 $\mu$m or less and an impurity concentration of $10^{24}$14 $10^{27}$ atoms/m$^3$. The portion of the region 52 sandwiched between the regions 54 and 55 has a thickness (horizontal direction in FIG. 4) of about 5 $\mu$m or less to be the base of the pnp transistor. The distance between the gate regions 55 is 2–10 $\mu$m to define the channel width of the inverter transistor. As the channel region, which is the portion of the region 52 existing between the gate regions 55, is of a high resistivity n$^-$ semiconductor having an impurity concentration of $10^{18}$14 $10^{21}$ atoms/m$^3$, the depletion layers extend greatly from the gate regions (p-n junction) to substantially close or pinch off the channel region at the zero gate voltage, and shrink to open the channel when the gate potential is raised.

Next, the operation of the circuit will be described. First, let us consider an instance wherein the load transistor $Q_{i1}$ is rendered off and the inverter transistor $Q_{d1}$ of the preceding stage is rendered off. In such a state, the channels of the inverter transistors $Q_{d1}$ and $Q_{d2}$ are closed (pinched off) by the depletion layer growing and extending from the respective gates. When a positive voltage is applied to the electrode I of the load transistor $Q_{i1}$, carriers (holes) are injected from the load transistor $Q_{i1}$ to the gate of the inverter transistor $Q_{d2}$. As the result of this hole injection, the gate potential of the inverter transistor $Q_{d2}$ increases to cause the depletion layer which extends from the gate-channel junction to shrink or contract. Thereby, the channel is opened to establish conduction between the source 51 and the drains 59, 60 and 61. In each of the inverter transistors, the dimensions and the impurity concentrations in the respective regions are determined to achieve the on-off switching in accordance with the variation of the gate potential from the ground potential (zero volt) to the built-in potential (approximately 0.3 to 0.7 volt) of the gate-channel junction.

When a positive voltage is applied to the gate electrode 62 of the inverter transistor $Q_{d1}$ of the preceding stage to turn the inverter transistor $Q_{d1}$ on with the inverter transistor $Q_{d2}$ having been already turned on, carriers (holes) which are injected into the gate of the inverter transistor $Q_{d2}$ are absorbed into the drain of the inverter transistor $Q_{d1}$ of the preceding stage through a connection wiring L. Then, the gate potential of the inverter transistor $Q_{d2}$ of the succeeding stage is caused to drop down to a low value which renders the inverter transistor $Q_{d2}$ off. Namely, each of the inverter transistors has such internal (source-to-drain) on-resistance that the drain-to-source voltage drop in the conductive state is below the threshold gate voltage for turning the inverter transistor (of the next stage) on.

As will be understood from the above-stated description, the inverter transistor of the semiconductor circuit according to the above-mentioned embodiment is formed with a junction field effect transistor of a sensitive enhancement mode, and hence there is no carrier storage effect, and the operation speed can be improved with very little power dissipation. Furthermore, in the conventional IIL semiconductor circuit comprising the inverter transistors formed with bipolar transistors, the thicknesses of the base and the emitter portions ($t_1$ and $t^2$ in FIG. 2) should be suppressed small for reducing the effect of carrier storage in the inverter transistor, and this is accompanied by a difficulty in the manufacture. Such difficulty encountered in the manufacture of the conventional devices, however, vanishes in the above-mentioned embodiment, and furthermore the number of the manufacturing steps can be reduced also.

Figure 6:
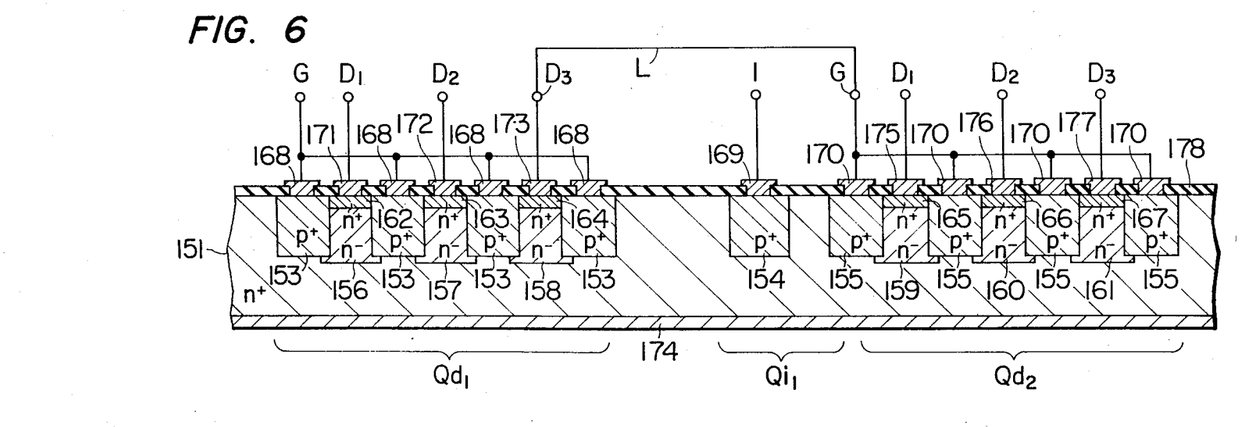
FIG. 6 is a partial cross-section of another example structure of the semiconductor integrated logic circuit shown in FIG. 3.

FIG. 6 shows another example structure of the semiconductor integrated circuit of FIG. 3. In this structure, p-type semiconductor regions 153, 154 and 155 of a low resistivity are formed in an n-type semiconductor wafer 151 of a low resistivity by relying on the selective diffusion technique. Next, a p-type impurity is selectively doped into the n-type semiconductor wafer 151 from the upper surface thereof by relying on the ion implantation technique to form compensated n-type semiconductor regions 156, 157, 158, 159, 160 and 161 of a high resistivity. Then, electrodes 168, 169, 170, 174, 171, 172, 173, 175, 176 and 177 are formed on the p-type semiconductor regions 153, 154 and 155, the n-type semiconductor wafer 151, and portions 162, 163, 164, 165, 166 and 167 of the n-type semiconductor wafer which is surrounded by the p-type semiconductor regions 153 and 155 and by the n-type semiconductor regions 156, 157, 158, 159, 160 and 161. Numeral 178 represents an oxide film.

In the above-stated structure, the p-type semiconductor regions 153, the n-type low resistivity semiconductor regions 162, 163 and 165, and the n-type high resistivity semiconductor regions 156, 157 and 158 serve respectively as the gate, the drains and the channels of a junction field effect transistor which, in turn, serves as the inverter transistor $Q_{d1}$. The grounded source of this inverter transistor $Q_{d1}$ is formed with the remaining portion of the n-type semiconductor wafer 151.

In the next stage, the p-type semiconductor region 154, the p-type semiconductor region 155 near the p-type semiconductor region 154 and the portion of the n-type semiconductor wafer 155 and 154 serve respectively as the emitter, collector and base of the load transistor $Q_{i1}$.

The p-type semiconductor regions 155, the n-type low resistivity semiconductor regions 165, 166 and 167, the n-type high resistivity semiconductor regions 159, 160 and 161, and the remaining portion of the n-type semiconductor wafer 151 serve respectively as the gate, drains, channels and source of the inverter transistor $Q_{d2}$.

The operation of this embodiment is substantially identical to that of the structure of FIG. 4. This embodiment has the advantages that the manufacturing steps are simpler than those of the structure of FIG. 4 and that the number of high precision mask alignment steps, which is one of the difficult steps in the manufacture of a semiconductor IC, can be reduced.

Figure 7:
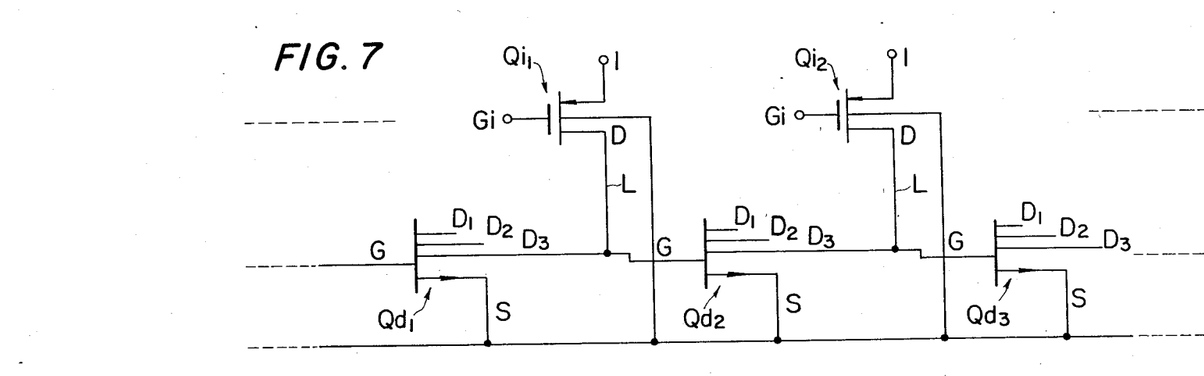
FIG. 7 is a partial electric connection diagram of the semiconductor integrated logic circuit according to still another embodiment of the present invention.

FIG. 7 shows a connection diagram of another embodiment of the semiconductor integrated logic circuit in which load transistors $Q_{i1}$, $Q_{i2}$, ... are formed with p-channel insulated-gate field effect transistors, when compared with the embodiment of FIG. 3.

Figure 8:
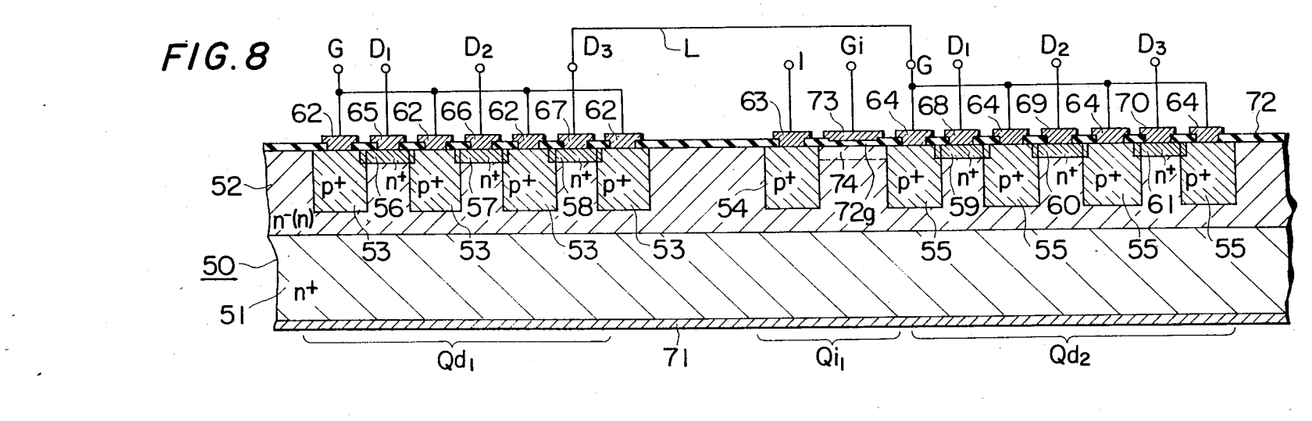
FIG. 8 is a partial cross-section of a structure of the semiconductor integrated logic circuit shown in FIG. 7.

An example of the cross-sectional structure of part of the semiconductor integrated logic circuit of FIG. 7 is shown in FIG. 8. In this figure, similar numerals to those in the previous figures indicate similar parts. On that portion of an n-type semiconductor layer 52 which is located between p-type semiconductor regions 54 and 55, there is formed a gate electrode 73 through a gate insulating film 72g. The p-type semiconductor region 54 and the p-type semiconductor region 55 jointly form the source and the drain of a p-channel insulated-gate field effect transistor serving as the load transistor $Q_{i1}$. A p-channel 74 of this load transistor $Q_{i1}$ is formed under this gate insulating film 72g. In other words, this load transistor $Q_{i1}$ is a p-channel insulated-gate field effect transistor having its drain 55 continuous or being merged to the gate 55 of the inverter transistor $Q_{d2}$.

The operation of the above-stated semiconductor circuit is basically similar to that of the device of FIG. 4. According to the above-mentioned embodiment, however, it should be noted that since both the inverter and the load transistors are comprised of field effect transistors, there can be obtained the following further advantages. Firstly, since both the inverter and the load transistor are field effect transistors (absence of a pn-junction in the current path), there is less limitation in the operation speed by the carrier storage effect, and hence it becomes possible to obtain an extremely high speed operation. Secondly, since the load transistor has a channel which is contiguous to the gate of the inverter transistor, and since carriers are injected into the gate of the inverter transistor through this channel, it will be noted that the leak of the carrier is extremely small, and that the carrier injection efficiency $\alpha$ of the load transistor is extremely high as shown in FIG. 9. Furthermore, such a high carrier injection efficiency $\alpha$ is held substantially constant up to the range of a considerably large current $I_i$. Therefore, the power loss can be reduced greatly, and the integration density and stability can both be much improved. In order to improve the switching speed of the semiconductor circuit, the gate capacitance of the inverter transistor, or the like, as well as the stray capacitances at various portions should be reduced to shorten the charge-discharge time-constant, and the quantity of the injection carriers should be increased. The above-mentioned features are very advantageous for achieving these requirements. Thirdly, the source-to-drain resistance of the load transistor in the conductive stage can be maintained at a low and almost constant value irrespective of the magnitude of the injection current. Thus, as compared with the bipolar load transistor, an equivalent or further larger current can be injected by applying a lower voltage to the injection electrode in the above-described load field effect transistor. Generally speaking, the injection current (emitter current) of a bipolar transistor has a tendency to exponentially increase with an increase in the applied voltage. In the normal operation condition, a higher voltage should be applied to the injection electrode of a bipolar transisotr than that for a field effect transistor for allowing the same quantity of injection current to flow.

Furthermore, as a result of utilizing an insulated-gate field effect transistor serving as the load transistor, the gate electrode can be utilized as a clocking control electrode. This provides a great advantage in constituting a dynamic logic system. In such an instance the injection electrode is connected to a constant voltage line, and clock pulses are applied to the high impedance gate electrode. Then, clocking can be accomplished with an extremely small power, and hence the clock circuit and so forth, can be extremely simplified and reduced in size.

Furthermore, though needless to say, it will be noted that by the employment of an insulated gate type field effect transistor as the load transistor, a high carrier injection efficiency α can be provided even where the channel of the load transistor is not very short.

Figure 10:
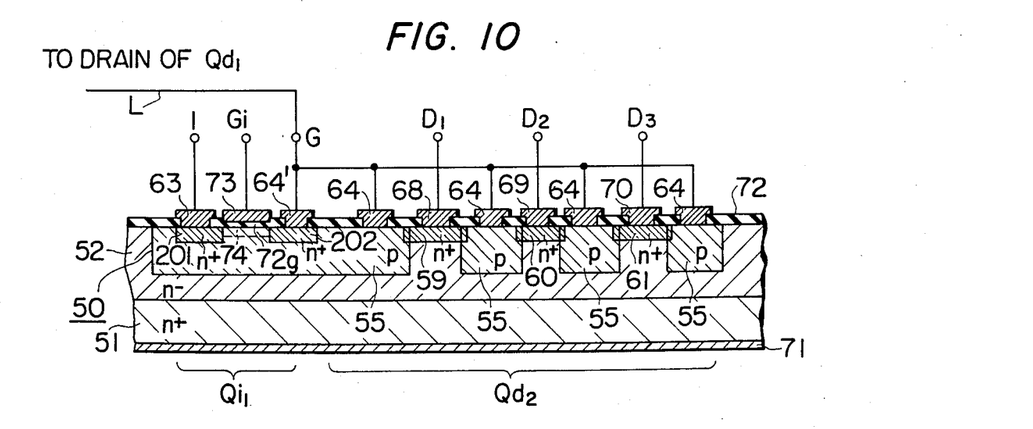
FIG. 10 is a partial cross-section of a further example structure of the semiconductor integrated logic circuit shown in FIG. 8.

FIG. 10 shows another example of the structure of the semiconductor device of FIG. 8, in which the load transistor $Q_{l1}$ is formed within the gate 55 of the inverter transistor $Q_{d2}$. In FIG. 10, n-type semiconductor regions 201 and 202 of a low resistivity respectively form a source and a drain of the load transistor $Q_{l1}$, respectively. A drain electrode 64' of this load transistor $Q_{l1}$ is connected to a gate electrode 64 of an inverter transistor $Q_{d2}$. Other portions of the structure are similar to those in FIG. 8. Although the inverter transistor $Q_{d1}$ of the preceding stage is not shown in FIG. 10, the interconnection to the inverter transistor of the preceding stage is similar to those of FIG. 8.

As has been described above, according to the above embodiments of the present invention, the problems of the prior art are solved, and a semiconductor integrated logic circuit having excellent operation performances and being easy to manufacture can be provided.

Figure 11:
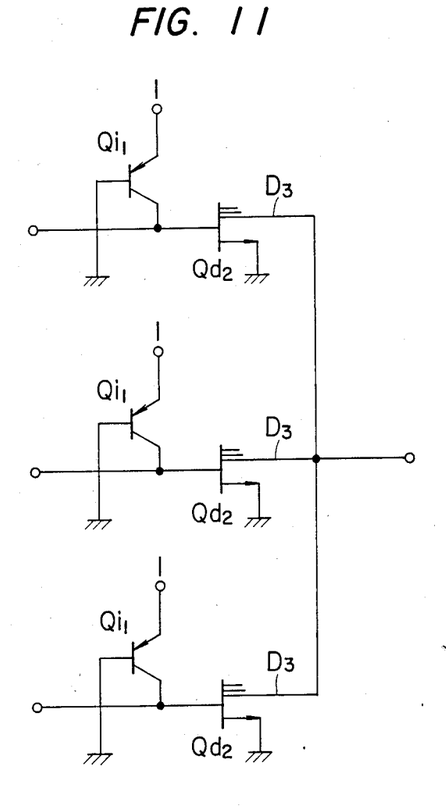
FIG. 11 is a circuit diagram of a logic circuit constituted by the devices according to the present invention.
Figure 12:
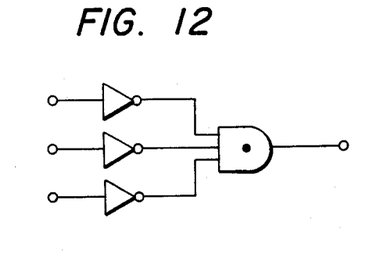
FIG. 12 is a logic diagram of the circuit shown in FIG. 11.

The semiconductor circuits according to above-mentioned various embodiments of the present invention are useful for various logics. Plural drains of one inverter transistor provide independently isolated same outputs which are to be connected to different succeeding circuits. If the drains of plural inverter transistors (one drain per one inverter transistor) are connected together in a wired AND fashion as shown in FIG. 11, there is constituted a logic circuit whose equivalent logic diagram is a shown in FIG. 12. Thus there is obtained a NOR logic circuit.

It will be apparent that this invention is not limited to the above embodiments, and various alternations and modifications are possible within the scope of the present invention. For example, it is evidently possible to reverse the conductivity type of the respective semiconductor regions of the above-mentioned embodiments. The inverter transistors may, indeed, not have multi-drain structures. The drain electrodes may be arranged to be in contact with a semiconductor body without the intervention therebetween of a low resistivity region, provided that the contact is made ohmic. On the contrary, the drain electrodes may be formed of a Schottky junction utilizing a high resistivity region to minimize the logic voltage amplitude within the possible range of the basic peformances, enabling more rapid operations.

Furthermore, in case isolation of the gate region of the junction field effect transistor is required in integrating the circuit, an isolation layer may be provided separately, or the emitter of the load transistor, may be designed to surround the gate region of the junction field effect transistor.

What is claimed is:

1. A semiconductor integrated circuit formed in a single semiconductor wafer having a principal surface and comprising:

at least one junction field effect transistor including source and drain elements, said source and drain elements defining at least one first current path constituting a source-drain path in a direction substantially perpendicular to said principal surface through a semiconductor region of a first conductivity type, a gate region adjoining said first current path and having a second conductivity type opposite to said first conductivity to develop a depletion layer which substantially pinches off said first current path without an external voltage applied to said gate region;

at least one carrier injector structure having a first region, a second region, a second current path connecting said first and second regions and an insulated electrode above said second current path, both of said first and second regions being formed within said gate region and having said first conductivity type, said first region being electrically connected by an external conductor to said gate region, said second current path being merged with said gate region, said second region being responsive to a biasing potential applied thereto to inject charge carriers through said second current path into said gate region thereby applying a forward biasing potential to said gate region to render said first current path conductive; and control means connected to said gate region for controlling the conduction of said first current path.

* * * * *